United States Patent
Tian et al.

(10) Patent No.: US 10,468,613 B2
(45) Date of Patent: Nov. 5, 2019

(54) MOTHERBOARD OF FLEXIBLE DISPLAY PANEL, CUTTING METHOD THEREOF, FLEXIBLE DISPLAY PANEL AND DISPLAY DEVICE

(71) Applicant: BOE TECHNOLOGY GROUP CO., LTD., Beijing (CN)

(72) Inventors: Hongwei Tian, Beijing (CN); Yanan Niu, Beijing (CN); Yueping Zuo, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/039,429

(22) Filed: Jul. 19, 2018

(65) Prior Publication Data
US 2019/0181362 A1 Jun. 13, 2019

(30) Foreign Application Priority Data
Dec. 8, 2017 (CN) .......................... 2017 1 1303133

(51) Int. Cl.
| | |
|---|---|
| H01L 27/32 | (2006.01) |
| H01L 51/00 | (2006.01) |
| H01L 51/52 | (2006.01) |
| B32B 3/26 | (2006.01) |
| H01L 51/56 | (2006.01) |
| G02F 1/1345 | (2006.01) |

(52) U.S. Cl.
CPC .......... *H01L 51/0097* (2013.01); *B32B 3/266* (2013.01); *G02F 1/13458* (2013.01); *H01L 27/3244* (2013.01); *H01L 51/5253* (2013.01); *H01L 51/56* (2013.01); *B32B 2457/20* (2013.01); *H01L 2251/5338* (2013.01); *H01L 2251/566* (2013.01)

(58) Field of Classification Search
None
See application file for complete search history.

(56) References Cited

U.S. PATENT DOCUMENTS

| | | | | |
|---|---|---|---|---|
| 2006/0270130 A1* | 11/2006 | Sato | ..................... | H01L 21/2026 438/166 |
| 2007/0195255 A1* | 8/2007 | Cho | .................. | G02F 1/133351 349/153 |
| 2016/0079539 A1* | 3/2016 | Kim | ..................... | H01L 27/3244 257/40 |

* cited by examiner

*Primary Examiner* — Minh Loan Tran
(74) *Attorney, Agent, or Firm* — Calfee, Halter & Griswold LLP

(57) ABSTRACT

Embodiment of the present disclosure provides a motherboard of flexible display panel, a cutting method thereof, a flexible display panel and a display device. The motherboard of flexible display panel includes: a plurality of display units; a space region, disposed to at least separate adjacent ones of the display unis; and a barrier strip, disposed in the space region and configured to stop a crack from extending towards the display units across the barrier strip.

20 Claims, 8 Drawing Sheets

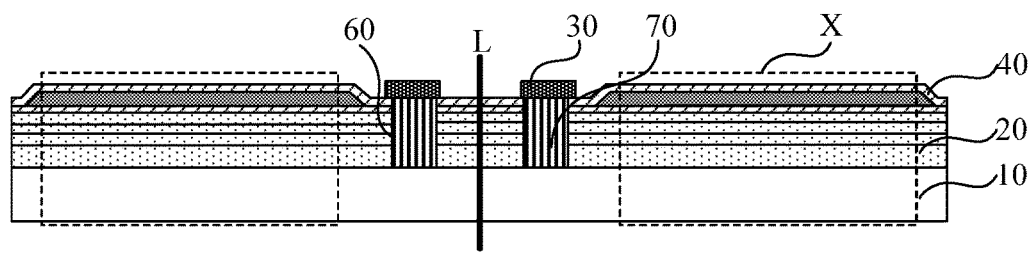
Fig. 16
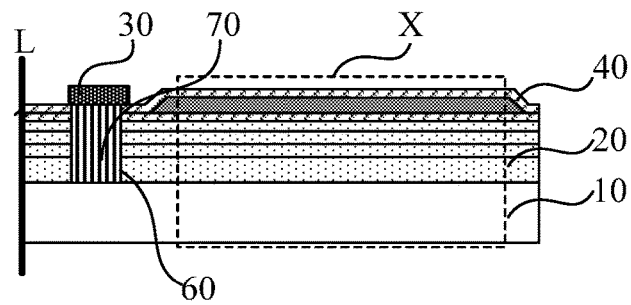
Fig. 17
| cutting the motherboard of flexible display panel according to the cutting line, the barrier strips being provided on both sides of the cutting line | S101 |
Fig. 18

MOTHERBOARD OF FLEXIBLE DISPLAY PANEL, CUTTING METHOD THEREOF, FLEXIBLE DISPLAY PANEL AND DISPLAY DEVICE

CROSS REFERENCE

The present application is based upon and claims priority to Chinese Patent Application No. 201711303133.6, filed on Dec. 8, 2017, and entitled "MOTHERBOARD OF FLEXIBLE DISPLAY PANEL, CUTTING METHOD THEREOF, FLEXIBLE DISPLAY PANEL AND DISPLAY DEVICE", and the entire contents thereof are incorporated herein by reference.

TECHNICAL FIELD

The present disclosure relates to the field of display technology, in particular, to a motherboard of flexible display panel, a cutting method thereof, a flexible display panel and a display device.

BACKGROUND

With the continuous improvement of people's living standards and the wide application of display devices in various fields of production and life, people's demand for display devices is also increasing. During the production process of the display device, in order to increase the production efficiency of the display device and reduce the production cost, the display device, either a TFT-LCD (Thin Film Transistor Liquid Crystal Display) or an OLED (Organic Light Emitting Diode, or Organic Electroluminescent Diode Display Device), etc., is manufactured on a motherboard and then cut and separated to further complete the post-stage module process. Taking the manufacturing of a motherboard of flexible display panel formed with a flexible substrate package, first, a plurality of display unit structures are simultaneously fabricated on the motherboard of flexible display panel in a highly-utilizable arrangement, and after packaging the manufactured plurality of display unit structure, cutting and separating are performed within a space region between adjacent two display units, and then other subsequent processes are performed on the multiple independent flexible display panels.

SUMMARY

Following technical solutions may be used in the embodiments of the present disclosure.

According to one aspect, embodiments of the present disclosure provide a motherboard of flexible display panel, including: a plurality of display units; a space region disposed to at least separate adjacent ones of the display unis; and a barrier strip, disposed in the space region and configured to stop a crack from extending towards the display units across the barrier strip.

In one embodiment the motherboard of flexible display panel includes a flexible base substrate and a plurality of inorganic insulating films provided on the flexible base substrate, and the barrier strip formed of stress barrier material is provided between a central line of the space region and the display units at both sides of the central line, and the barrier strip is extended along a longitudinal direction of the space region, and the barrier strip is in contact with at least one of the inorganic insulating films. In one embodiment, at least two barrier strips may be formed between the central line of the space region and each of the display units at both sides of the central line.

In one embodiment, at least two columns of barrier strip extending along the longitudinal direction of the space region may be disposed between the central line of the space region and the display units at both sides of the central line, and each column of barrier strip comprises a plurality of barrier segments arranged end to end, with an interval between adjacent two of the plurality of barrier segments, and a position of the interval in one column of the barrier strip and a position of the interval in an adjacent column of the barrier strip are not formed on a same line along a width direction of the space region.

In one embodiment, the barrier strip may have at least one of linear shape, folded line shape or arc shape.

In one embodiment, the barrier strip may include a plurality of layers of barrier strip, and the barrier strips in different layers are connected to each other at at least one position.

In one embodiment, the barrier strip may include a metal strip formed of a metal film.

In one embodiment, the barrier strip may include a groove. In one embodiment, the groove may be filled with metal.

In one embodiment, the barrier strip may include a groove and a metal strip formed of a metal film. In one embodiment, the groove may be filled with metal.

In one embodiment, the display unit may include a thin film transistor comprising a gate electrode layer and a source/drain electrode layer, and the barrier strip may be disposed in a same layer with at least one of the gate electrode and the source/drain electrode layer.

In one embodiment, the barrier strip may include a same material as the gate electrode layer or the source/drain electrode layer that is disposed in the same layer.

In one embodiment, the barrier strip may be disposed in two layers that are respectively the same with the gate electrode and the source/drain electrode layer, and the barrier strips in the two layers may be connected to each other at at least one position.

In one embodiment, the motherboard of flexible display panel may include a thin film encapsulation, and the barrier strip may be formed in a portion of the thin film encapsulation corresponding to the space region.

In one embodiment, the thin film encapsulation may include a first inorganic layer exposed to the outside, a second inorganic layer at the inner side and an organic layer interposed between the first and second inorganic layers, and the barrier strip may be formed in a portion of at least one of the first and second inorganic layers corresponding to the space region.

In one embodiment, the motherboard of flexible display panel may include a flexible base substrate, a first inorganic layer and a second inorganic layer of the thin film encapsulation are disposed on the flexible base substrate at the space region, a groove penetrating the first inorganic layer and the second inorganic layer and exposing the flexible base substrate is formed in the space region, and the barrier stripe is formed at least partly in the groove.

In one embodiment, the groove may be filled with organic material, and the barrier strip may at least partly cover the groove.

According to one aspect, embodiments of the present disclosure provide a flexible display panel, including: a display unit; a peripheral region around the display unit, and a barrier strip provided in the peripheral region and configured to stop a crack from extending towards the display units across the barrier strip.

According to an aspect, the present disclosure provides a display device including the above flexible display panel.

According to an aspect, the present disclosure provides a method for cutting a motherboard of flexible display panel including: providing the above motherboard of flexible display panel; cutting the motherboard of flexible display panel according to the central line of the space region as a cutting line, such that the barrier strip is provided respectively on both sides of the cutting line.

BRIEF DESCRIPTION OF THE DRAWINGS

In order to more clearly illustrate the technical solutions of the embodiments of the present disclosure or the related art, drawings required for describing the embodiments of the present disclosure or the related art will be briefly described below. It will be apparent that the drawings in the following description refer only to some embodiments of the present disclosure, and other drawings are available to one of ordinary skill in the art without creative work.

FIG. 16 is a ninth schematic diagram illustrating a layered structure of a motherboard of flexible display panel according an embodiment of the present disclosure;

FIG. 17 is a schematic diagram illustrating a layered structure of a flexible display panel according an embodiment of the present disclosure; and FIG. 18 is a flowchart illustrating a method for cutting a motherboard of flexible display panel according an embodiment of the present disclosure.

REFERENCE SYMBOLS IN THE DRAWINGS

10-flexible base substrate; 20-inorganic insulating film; 30-barrier strip; 31-barrier segment; 40-packaging film; 50-thin film transistor; 60-groove; 70-organic material; I-central line of the space region; L-cutting line; X-display unit; Y-space region; Z-peripheral region.

DETAILED DESCRIPTION

Hereinafter, technical solutions according to embodiments of the present disclosure will be described clearly and completely in conjunction with the accompanying drawings of the embodiments of the present disclosure. It is obvious that the described embodiments are part of the embodiments rather than all embodiments of the present disclosure. All other embodiments obtained by one of ordinary skill in the art based on the described embodiments of the present disclosure without the need for creative work are within the scope of the present disclosure.

While cutting the motherboard of flexible display panel as well as transferring, operating and using the cut flexible display panel in a subsequent process, stress cracks may occur at the edge portion of the thin film packaging of the flexible display panels. Once the cracks are generated, the cracks may further extend to the interior of the device, and make the moisture in the external air into the interior of the device through the cracks, leading to an abnormal display of the device or a failure of the device.

Embodiments of the present disclosure provide a motherboard of flexible display panel, a cutting method thereof, a flexible display panel and a display device, which may solve the problems that stress cracks may occur at the edge portion of the thin film packaging of the flexible display panels and further extend to the interior of the device while cutting the motherboard of flexible display panel as well as transferring, operating and using the cut flexible display panel in a subsequent process.

Figure 1:
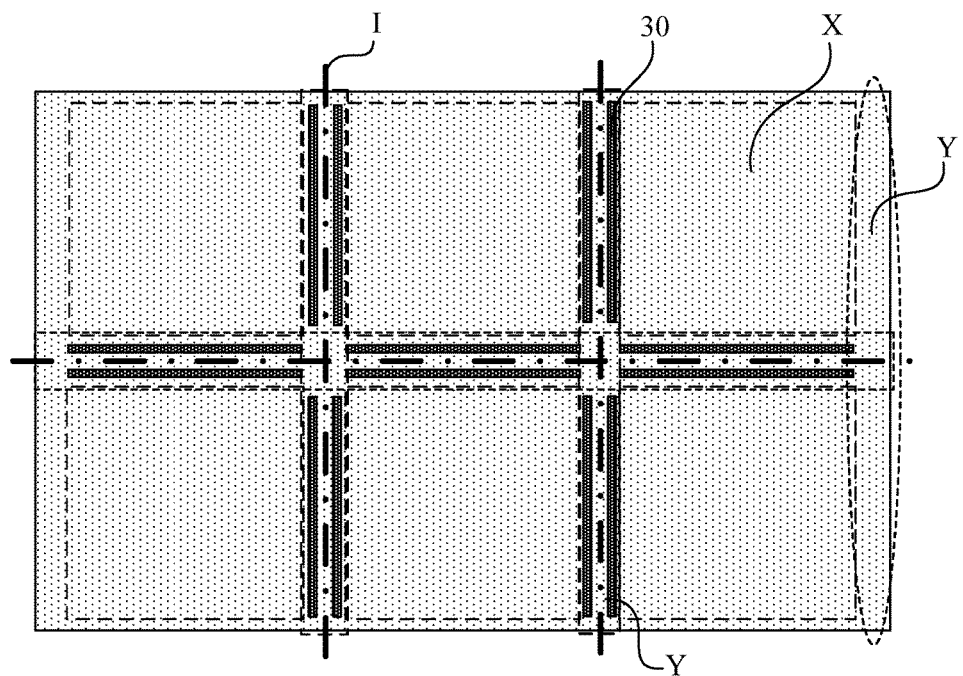
FIG. 1 is a first schematic diagram illustrating a structure of a motherboard of flexible display panel according an embodiment of the present disclosure.
Figure 2:
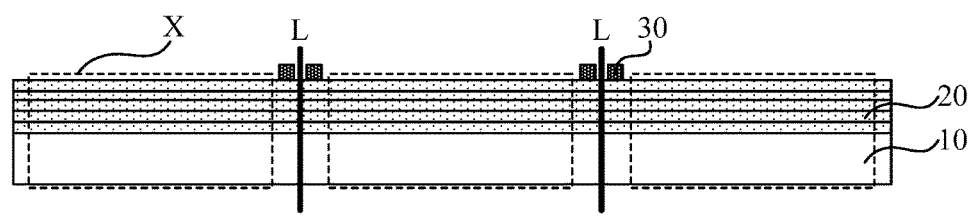
FIG. 2 is a first schematic diagram illustrating a layered structure of a motherboard of flexible display panel according an embodiment of the present disclosure.

An embodiment of the present disclosure provides a motherboard of flexible display panel, as illustrated in FIG. 1, the motherboard of flexible display panel includes a plurality of display units X and a space region Y between any adjacent two of the display units X. As illustrated in FIG. 2, the motherboard of flexible display panel includes a flexible base substrate 10 and a plurality of inorganic insulating films 20 provided on the flexible base substrate 10. A barrier strip 30 is provided between a central line I (not illustrated in FIG. 2, please refer to FIG. 1) of the space region Y and the display units X at both sides of the central line I, the barrier strip 30 is disposed in the space region Y and is configured to stop the crack from extending towards the display units X across the barrier strip 30. In one embodiment, the barrier strip 30 may be formed of stress barrier material. The barrier strip 30 is extended along a longitudinal direction of the space region Y. In one embodiment, and the barrier strip 30 is in contact with at least one of the inorganic insulating films 20.

In one embodiment, the barrier strip includes a metal strip formed of a metal film. In one embodiment, the barrier strip includes a groove and a metal strip formed of a metal film. The groove may be filled with metal.

In the present disclosure, the width direction of the space region is a direction in which the distance between adjacent display units is located, and the length direction of the space region is a direction perpendicular to the width direction, i.e., a direction in which the space region extends between adjacent units.

It should be noted that, firstly, as illustrated in FIG. 2, a motherboard for manufacturing a flexible OLED (Organic Light Emitting Diode), such as a flexible oxide OLED, a low temperature poly-silicon OLED (LTPS OLED) or the like, is used as an example of the motherboard of flexible display panel in the embodiment of the present disclosure. In the embodiment, the motherboard of flexible display panel may be formed by providing devices on a motherboard substrate and then aligning a flexible cover substrate. In one embodiment, in the motherboard of flexible display panel formed in this way, the plurality of inorganic insulating films 20 may include the gate insulating layer for forming thin film transistors in the display unit X, the interlayer dielectric layer or the like, or may include the blocking layer generally formed on the flexible base substrate for blocking the moisture and the oxygen, the buffering layer or the like. In addition, in the related art, the structure formed on the flexible base substrate 10 are generally packaged using a thin film encapsulation (TFE) process. The thin film encapsulation structure generally includes a three-layer structure in which an organic film is sandwiched between two inorganic films. That is, the thin film encapsulation structure includes a first inorganic layer exposed to the outside (i.e., away from the base substrate), a second inorganic layer at the inner side (i.e., close to the base substrate) and an organic layer interposed between the first and second inorganic layers. The barrier strip may be formed in a portion of at least one of the first and second inorganic layers corresponding to the space region.

Figure 3:
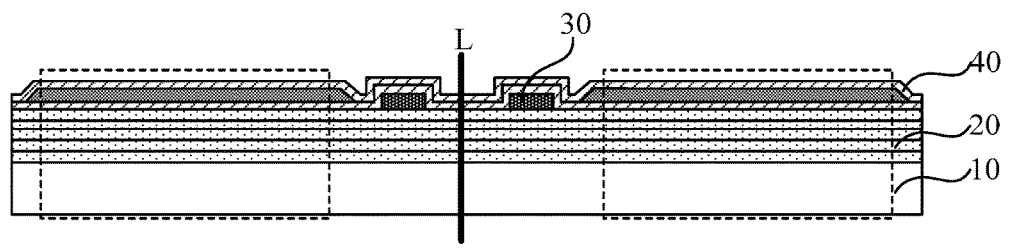
FIG. 3 is a second schematic diagram illustrating a layered structure of a motherboard of flexible display panel according an embodiment of the present disclosure.

In one embodiment, in the motherboard of flexible display panel formed by TFE process, the plurality of inorganic insulating films 20 further include, in addition to the inorganic insulating layers such as the gate insulating layer for forming thin film transistors, the interlayer dielectric layer, the blocking layer, the buffering layer or the like, the two inorganic layers in the TFE film 40, as illustrated in FIG. 3. In one embodiment, hereinafter, detailed description is made on an example in which the flexible base substrate 10 and the device structures formed on the flexible base substrate 10 are packaged using the TFE process.

Secondly, as illustrated in FIG. 1, the display unit X refers to an area occupied by a necessary portion of a flexible display panel obtained by cutting the motherboard of flexible display panel. The display unit X includes a display portion necessary for the display of the flexible display panel, and also includes a portion of the periphery of the display portion that provides a signal line for the display and the like, which is not allowed to be cut off. For example, the display unit X on the motherboard of flexible display panel may include a portion for subsequently forming the display region (also referred to as an Active Area, abbreviated as AA area) of the display screen, and may also include a portion for subsequently forming the non-display region (including drive circuits, such as GOA circuits, etc., and may also include areas for providing other chips).

Thirdly, the space region Y refers to the peripheral portion of the display unit X, including a portion between any two adjacent display units X (as shown by the rectangular dotted frame surrounding the barrier strip 30 in FIG. 1), and a portion is between the display unit X on the periphery of the motherboard of flexible display panel and the boundary of the motherboard of flexible display panel (as shown by an oval dotted box at the edge position in FIG. 1). For the flexible display panel after cutting, whether in the space area Y between any two adjacent display units X on the motherboard of flexible display panel, or in the space area Y between the display unit X located on the periphery of the motherboard of flexible display panel and the boundary of the motherboard of flexible display panel, cracks may be generated at the edge due to collision during the subsequent process or use. The cracks generated during the cutting process due to stress usually occurs on both sides of the cutting position, that is, the space region Y between any two adjacent display units X on the motherboard of flexible display panel. As illustrated in FIG. 2, while cutting the motherboard of flexible display panel along the cutting line L, cracks may occur at the space region Y at both sides of the cutting line L. Hereinafter, with respect to the barrier strip 30 and other structures provided in the space region Y, a space region Y disposed between any two adjacent display units X on the motherboard of flexible display panel is taken as an example, while this does not mean that the barrier strip 30 and other structures are not provided in the space region Y between the display unit X on the periphery of the motherboard of flexible display panel and the boundary of the motherboard of flexible display panel.

Fourthly, those skilled in the art should appreciate that in the cutting process of the motherboard of flexible display panel, the space region Y is not completely cut off. Generally, in the cutting process, cutting is performed along the cutting line L in the space region Y, and the two adjacent display units X may be separated along one cutting line L. In one embodiment, as shown in FIG. 2, the cutting line L is disposed at the position of the central line I of the space region Y or the position approximate to the central line I of the space region Y.

Fifthly, in one embodiment, as illustrated in FIG. 1, the barrier strip 30 may be formed by stress barrier material, which may form a certain barrier effect on the stress generated on the inorganic insulating film in contact with the barrier strip 30. In one embodiment, metal material, organic material or the like may, to some degree, form a certain barrier effect on the stress. The stress is blocked or weakened, the occurrence of stress cracks at the edge of the flexible display panel can be reduced, thereby reducing the possibility of cracks further extending into the interior of the display unit X, or, reducing the adversely effect on the display effect caused by the moisture and impurities in the external air entering into the interior of the display unit X due to the presence of the cracks at the edge portion.

Sixthly, as illustrated in FIG. 1, the barrier strip 30 extends in a longitudinal direction of the space region Y. In one embodiment, the barrier strip 30 generally has a strip shape having an extending direction identical or substantially identical to the longitudinal direction of the space region Y. For example, when a relatively small angle, e.g., an angle smaller than 5 degrees, exists between the extending direction of the barrier strip 30 and the longitudinal direction of the space region Y, the extending direction of the barrier strip 30 may be considered as being extended along the longitudinal direction of the space region Y.

Seventhly, as the barrier strip 30 extends along the longitudinal direction of the space region Y, which is in the direction perpendicular or substantially perpendicular to the direction along which the stress crack may be generated, the inorganic insulating film 20 contacting the barrier strip 30 may be reinforced in a manner similar to a barrel hoop, which reduces the possibility of occurrence of cracks and reduces the tendency of cracks that have been generated to propagate further into the interior of the device. Accordingly, the barrier tape 30 should be in contact with at least one inorganic insulating film 20.

Embodiments of the present disclosure provide a motherboard of flexible display panel, a cutting method thereof, a flexible display panel and a display device, including a plurality of display units and a space region between adjacent display units, wherein the motherboard of flexible display panel includes a flexible base substrate and a plurality of inorganic insulating films provided on the flexible base substrate, a barrier strip formed of stress barrier material is provided between a central line of the space region and the display units at both sides of the central line, the barrier strip is extended along a longitudinal direction of the space region, and the barrier strip is in contact with at least one of the inorganic insulating films. By providing the barrier strip in contact with at least one inorganic insulating film in the space region, when cutting the motherboard of flexible display panel, the barrier strip may be respectively disposed on both sides of the cutting line, and the barrier strip may reduce the cutting stress during the cutting, reduce the possibility of cracks generated at the edge portion of the flexible display panel. In the subsequent processes of transferring, operating and using after the cutting process, the flexible display panel provided with the barrier strip can also reduce the occurrence of cracks at the edge portion thereof and further extending into the interior of the flexible display panel, thereby improving the production yield of flexible display panel.

Figure 4:
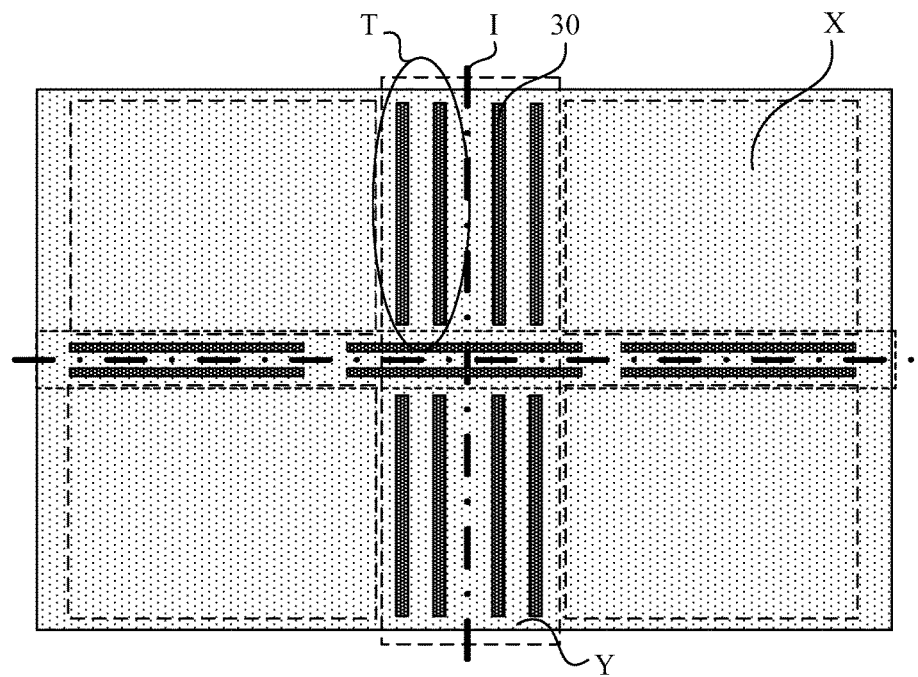
FIG. 4 is a second schematic diagram illustrating a structure of a motherboard of flexible display panel according an embodiment of the present disclosure.

In one embodiment, as illustrated in FIG. 4, at least two barrier strips 30 are provide between the central line I of the space region Y and each of the display units X at both sides of the central line I.

It should be noted that, since the actual size of the space region Y is very narrow and small compared to the display unit X in the motherboard of flexible display panel according to the embodiments of the present disclosure, in order to clearly illustrate the respective structures provided in the space region Y in the drawings, the space region Y is appropriately scaled up in the drawings of the embodiments of the present disclosure, which, as schematic diagrams, does not represent the actual proportional relationship between the space region Y and the display unit X in the motherboard of flexible display panel.

As illustrated in FIG. 4, two barrier strips 30 are provided between the central line I of the space region Y and each one of the display units X at both sides of the central line I. In this case, by providing multiple barrier strips 30, it is possible to provide multiple-protection against the cracks generated in the edge region of the flexible display panel, to better prevent the cracks from further extending into the interior of the flexible display panel.

Figure 5:
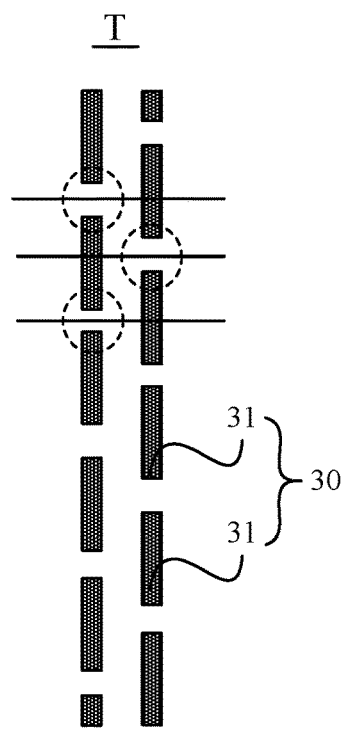
FIG. 5 is a first partial enlarged view of the region T in FIG. 4.

Further, as illustrated in FIG. 5, at least two columns of barrier strip 30 are disposed between the central line I of the space region Y and the display units X at both sides of the central line I. Each column of barrier strip 30 includes a plurality of barrier segments 31 arranged end to end with an interval between adjacent two of the plurality of barrier segments, and a position of the interval in one column of the barrier strip 30 and a position of the interval in an adjacent column of the barrier strip 30 are not formed on a same line along a width direction of the space region Y. Alternatively, as illustrated in FIG. 6, at least two barrier strips 30 are arranged in a same direction, and a head of one barrier strip 30 is staggered with a tail of another barrier strip 30 adjacent to the one barrier strip 30.

In one embodiment, as illustrated in FIG. 5, the barrier strip 30 includes a plurality of barrier segments 31 arranged end to end with an interval between adjacent two of the plurality of barrier segments, and the barrier segments 31 within one barrier strip 30 are arranged in the same direction with an interval between heads and tails of the barrier segments 31, as illustrated by the round dotted box in FIG. 5. The intervals between adjacent barrier strips 30 are not arranged in the same line along the width direction of the space region Y. Generally, cracks generated in the edge region of the flexible display panel due to collision or cutting of the motherboard may extend along the width direction of the space region Y toward the interior of the flexible display panel. In the case where the intervals between adjacent barrier strips are arranged in the same line along the width direction of the space region Y, if the generated crack is located exactly at the gap position between the two adjacent barrier segments 31, the provided barrier strips 30 cannot fasten and block the crack. Therefore, it is necessary to arrange the positions of the intervals of the adjacent barrier strips 30 in different straight lines along the width direction of the space region Y to achieve the protection of the edges of the entire display unit X.

In addition, if a crack is generated at the position of one barrier segment 31, the barrier segment 31 may be deformed (e.g., warping or the like) after fastening and blocking the crack. In the barrier strip 30 including the plurality of barrier segments 31 arranged end to end with an interval between adjacent two of the plurality of barrier segments, when one of the barrier segment 31 is deformed (e.g., warping or the like) due to bearing the stress crack, the fastening effect of other barrier segments 31 will not be affected.

Figure 6:
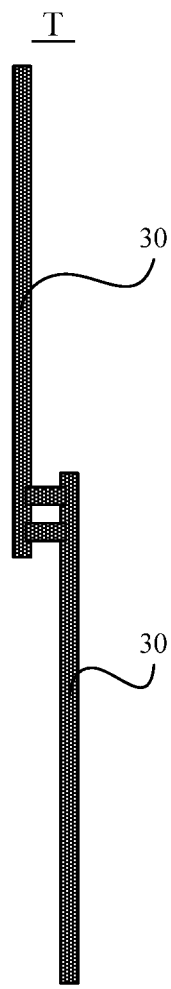
FIG. 6 is a second partial enlarged view of the region T in FIG. 4.

For another example, as illustrated in FIG. 6, two barrier strips 30 are arranged in the same direction, and a head of one barrier strip 30 is staggered with a tail of another barrier strip 30 adjacent to the one barrier strip 30.

Two barrier strips 30 are arranged in the same direction may refer to the case where the barrier strips 30 are arranged in parallel or substantially in parallel. In the present embodiment, a head of one barrier strip 30 is staggered with a tail of another barrier strip 30 adjacent to the one barrier strip 30 may refer to the case where the heads and tails are staggered in a same plane as illustrated in FIG. 6. Alternatively, when the two barrier strips 30 are arranged in different layers, the heads and tails may be staggered according to a projection relationship as illustrated in FIG. 6, such that a head of one barrier strip 30 in one layer is staggered with a corresponding space of a tail of another barrier strip 30 in another layer. In one embodiment, when the two barrier strips 30 are arranged in different layers, the staggered portions of the two barrier strips 30 may be connected via a via hole to further improve the stress absorption capacity of the two barrier strips 30.

Optionally, the barrier segment 31 may have a shape of linear, folded line or arc.

As illustrated in FIG. 5, the barrier segment 31 has a linear shape, and the plurality of linear barrier segment 31 are not inter connected. In the case where one barrier segment 31 is deformed (e.g. warping), it will not cause deforming on other barrier segments 31.

Figure 7:
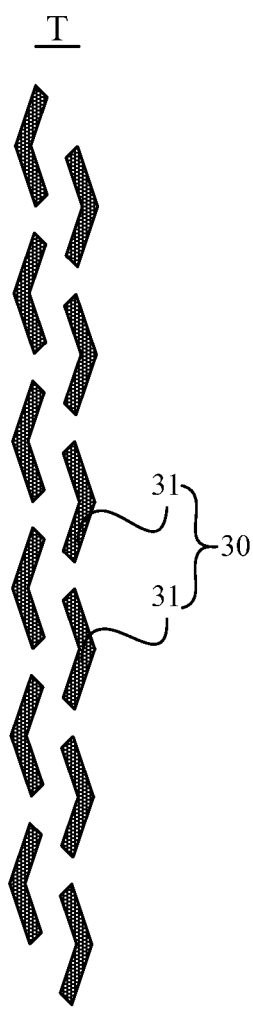
FIG. 7 is a third partial enlarged view of the region T in FIG. 4.

As illustrated in FIG. 7, the barrier segment 31 may also have a folded line shape (e.g., a zigzag shape). In the case where the barrier segment 31 has a folded line shape and the crack extends to one wing of the folded line of the barrier segment 31, the wing of the folded line may fasten and block the crack and prevent the crack from entering the interior of the flexible display panel across the wing of the folded line of the barrier segment 31. Meanwhile, the wing of the folded line of the barrier segment 31 may be deformed (e.g., warped) at the position where the crack meets the barrier segment 31 due to the stress of the crack. Since the two wings of the folded line of the barrier segment having the folded line shape have different angles and thus the directions of the stress are also different, the deformation (warping) generated in one wing will not affect the other wing, which improves the effective utilization of the fastening and blocking of the crack by the barrier segment 31.

Figure 8:
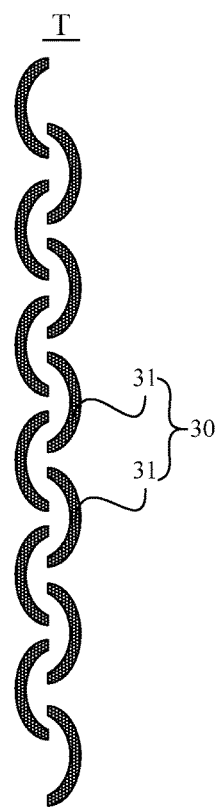
FIG. 8 is a fourth partial enlarged view of the region T in FIG. 4.

As illustrated in FIG. 8, in one embodiment, the barrier segment 31 may also have an arc shape. The arc barrier segment not only achieves a high utilization rate of the above barrier segment 31 with folded line shape, but also has a maximum contact length with the crack under the same length, which may block the crack as much as possible. Since the tangential directions are not the same in all parts of the arc, the arc-shaped barrier segment 31 is less prone to warping deformation on the barrier strip 31 due to the blocking of the crack.

In addition, the barrier segment 31 may further include other shape except the above described linear shape, folded line shape or arc shape, and no more example will be given here.

Figure 9:
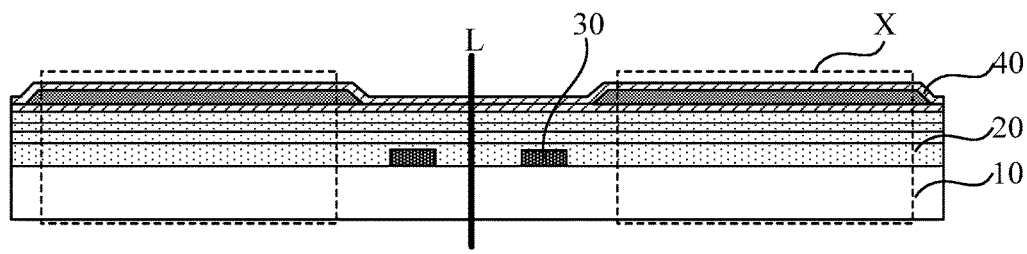
FIG. 9 is a third schematic diagram illustrating a layered structure of a motherboard of flexible display panel according an embodiment of the present disclosure.

Further, as illustrated in FIG. 9, the barrier strip 30 is provided on the flexible base substrate 10 and is in contact with the inorganic insulating film 20 adjacent to the flexible base substrate. Additionally or alternatively, the barrier strip 30 is provided on any inorganic insulating film 20 and in contact with the inorganic insulating film 20.

In one embodiment, as illustrate in FIG. 9, the barrier strip 30 may be provided on the flexible base substrate 10, such that the barrier strip 30 is in contact with the inorganic insulating film 20 adjacent to the flexible base substrate. When cracks are generated at the edges of the flexible display panel, cracks propagate on the laminated inorganic insulating film 20, and the barrier strip 30 in contact with the underlying inorganic insulating film 20 may fix the crack in the inorganic insulating film 20, to reduce the possibility of cracks further propagating into the interior of the flexible display panel. Alternatively, the barrier strip 30 may be provided on anyone of the inorganic insulating films 20. Generally, with respect to other layers formed between the plurality of inorganic insulating films 20, for example the metal material layer for forming the gate line or the data line, the pattern is formed only in the display region, and at the position of the above space region Y, generally only a plurality of inorganic insulating films 20 are stacked. Accordingly, it is possible to effectively block the cracks progressing in the stacked inorganic insulating films 20 by providing the barrier strip 30 on anyone of the inorganic insulating films 20.

Figure 10:
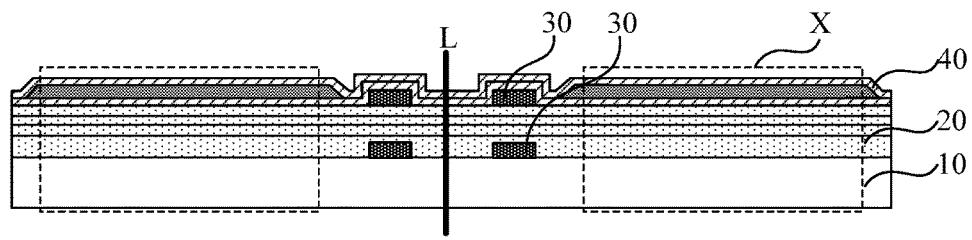
FIG. 10 is a fourth schematic diagram illustrating a layered structure of a motherboard of flexible display panel according an embodiment of the present disclosure.

For example, as illustrated in FIG. 3, the barrier strip 30 is formed on the last inorganic insulating film 20 before forming the packaging film 40. For another example, the barrier strip 30 may be formed repeatedly on different layers among the plurality of inorganic insulating films 20. As illustrated in FIG. 10, the barrier strip 30 is formed on the flexible base substrate 10, and the barrier strip 30 is further formed on the last inorganic insulating film 20 before forming the packaging film 40.

Figure 11:
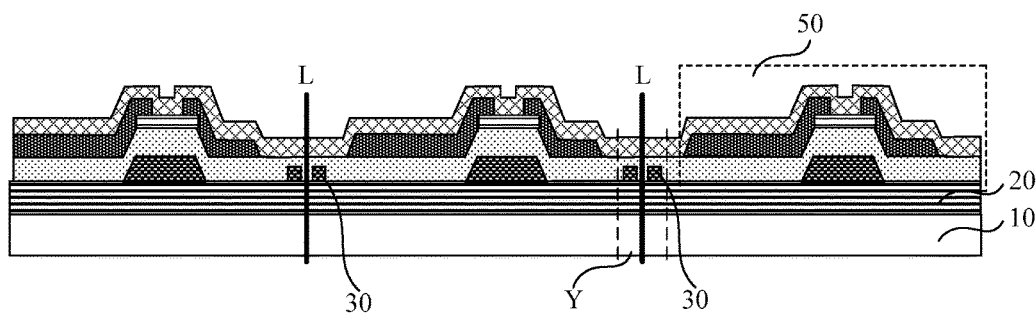
FIG. 11 is a fifth schematic diagram illustrating a layered structure of a motherboard of flexible display panel according an embodiment of the present disclosure.

Optionally, as illustrated in FIG. 11, a thin film transistor (TFT) 50 is included in the display unit X of the motherboard of flexible display panel. The barrier strip 30 is a metal barrier strip 30, and the metal barrier strip 30 and the source and drain electrodes of the TFT 50 are formed in the same layer with the same material. Additionally or alternatively, the metal barrier strip 30 and the gate electrode of the TFT 50 are formed in the same layer with the same material.

As illustrated in FIG. 11, the TFT 50 is included in the display unit X of the motherboard of flexible display panel, and in one embodiment, the TFT 50 includes a gate electrode, a gate insulating layer, a semiconductor active layer, a source electrode, a drain electrode, and a passivation layer which are disposed successively. The barrier strip 30 in the embodiment of the present disclosure is a metal barrier strip 30, and the metal barrier strip 30 and the gate electrode of the TFT 50 are the formed in the same layer using the same material. That is, the pattern of the metal barrier strip 30 is formed in the space region Y at the same time when the gate electrode of the TFT 50 in the display unit X is fabricated through one patterning process, so that it is not necessary to additionally increase the process steps of fabricating the pattern of the metal barrier strip 30. Then, subsequent film layers of the display unit X are formed, and the flexible display panel including the metal barrier strip 30 of the same layer as the gate electrode of the TFT 50 is formed.

Figure 12:
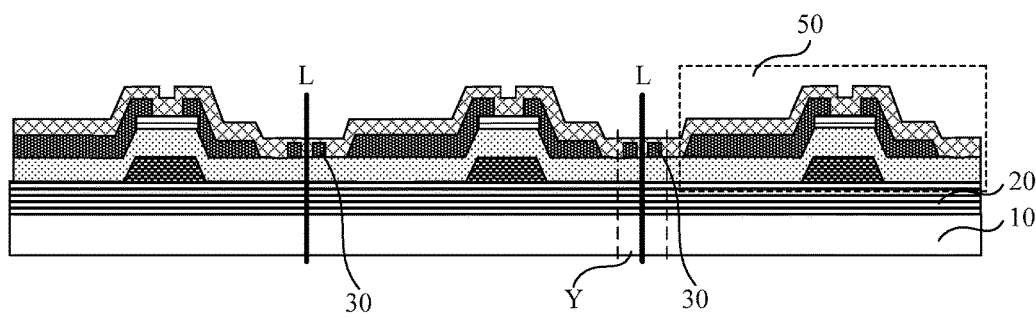
FIG. 12 is a sixth schematic diagram illustrating a layered structure of a motherboard of flexible display panel according an embodiment of the present disclosure.

Alternatively, as illustrated in FIG. 12, the barrier strip 30 in the embodiment of the present disclosure is a metal barrier strip 30, and the metal barrier strip 30 and the source and drain electrodes of the TFT 50 are the formed in the same layer using the same material. That is, the pattern of the metal barrier strip 30 is formed in the space region Y at the same time when the source and drain electrodes of the TFT 50 in the display unit X are fabricated through one patterning process, so that it is not necessary to additionally increase the process steps of fabricating the pattern of the metal barrier strip 30. Then, subsequent film layers of the display unit X are formed, and the flexible display panel including the metal barrier strip 30 of the same layer as the source and drain electrodes of the TFT 50 is formed.

Figure 13:
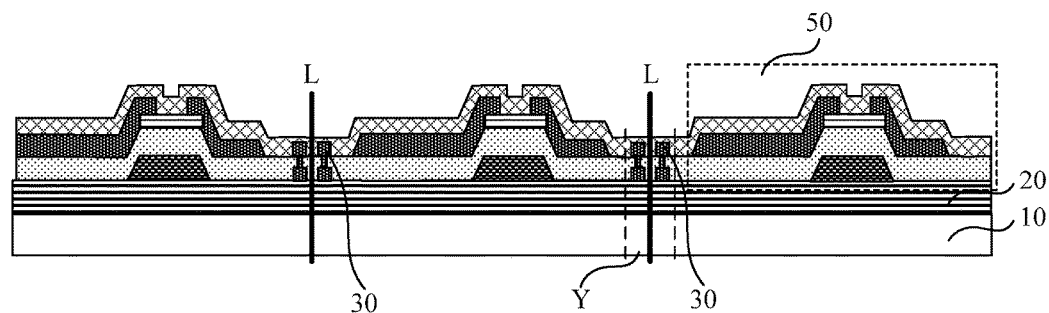
FIG. 13 is a seventh schematic diagram illustrating a layered structure of a motherboard of flexible display panel according an embodiment of the present disclosure.

Further, as illustrated in FIG. 13, the metal barrier strips 30 are provided in multiple layers, and the metal barrier strips 30 in different layers are connected via a via hole at at least one position.

In this way, as illustrated in FIG. 13, in one embodiment, the display unit X on the motherboard of flexible display panel includes a TFT 50 including a gate electrode, a gate insulating layer, a semiconductor active layer, a source electrode, a drain electrode, and a passivation layer which are disposed successively. While forming the TFT 50, the pattern for forming the metal barrier strip 30 is formed at a corresponding position of the space region Y. While forming the source and drain electrodes of the TFT 50, the pattern for forming the metal barrier strip 30 is formed at a corresponding position of the space region Y. In addition, in the layered structure between two layers of metal barrier strips 30, a via hole is formed correspondingly to connect the two layers of metal barrier strips 30 in different layers. In the case where two layers of metal barrier strips 30 are connected via the via hole, when one layer of metal barrier strip 30 absorbs the stress and blocks the crack, a part of the absorbed stress may be dispersedly transferred to the other layer of metal barrier strip 30, to improve the ability and effect of absorbing stress and blocking crack of the multi layered metal barrier strips 30.

Figure 14:
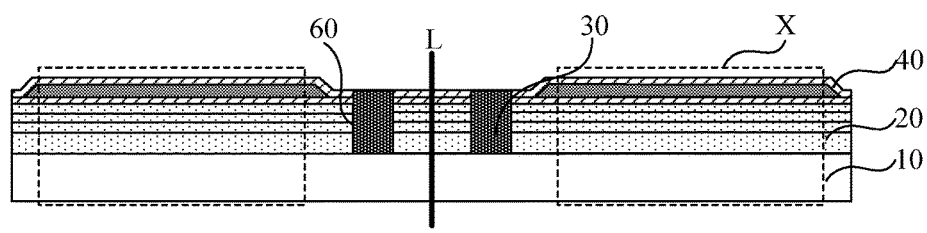
FIG. 14 is an eighth schematic diagram illustrating a layered structure of a motherboard of flexible display panel according an embodiment of the present disclosure.

Optionally, as illustrated in FIG. 14, a groove 60 for exposing the flexible base substrate 10 is further provide on the plurality of inorganic insulating films 20 in the space region Y, and the groove 60 is arranged to extend along both sides of the central line I of the space region Y. The barrier strip 30 is provided at least partly within the groove 60.

Before forming the barrier strip 30 on the motherboard of flexible display panel, the groove 60 in the space region Y is firstly formed in the inorganic insulating film 20 formed on the flexible base substrate 10. The groove 60 may expose the flexible base substrate 10. That is, the formed groove 60 penetrates the plurality of inorganic insulating films 20 till the flexible base substrate 10. In the present embodiment, the method for forming the groove in the inorganic insulating film 20 is not particularly limited in the embodiments of the present disclosure. For example, the groove 60 may be formed by a dry etching process. Afterwards, the barrier strip 30 is formed in the groove 60. In the present embodiment, the barrier strip 30 is provided at least partly in the groove 60. In one embodiment, as illustrated in FIG. 14, the stripe 30 is completely filled in the groove 60. Alternatively, the barrier strip 30 may have a projection area greater than the hollow area of the groove 60. In additional to a part of the barrier strip 30 disposed in the groove 60, another part of the barrier strip 30 is disposed on the inorganic insulating film 20 at the edge portion of the groove 60.

As illustrated in FIG. 14, the barrier strip 30 is in contact with the edge of the groove 60 in the groove 60. When the inorganic insulating film 20 is cracked due to stress, and the crack is extended to the interior of the flexible display panel, at the position of the groove 60, since the inorganic insulating film 20 is excavated, the crack loses the carrier for further propagating on the inorganic insulating film 20, and at the same time, the barrier strip 30 contacts the edge of the groove 60, and the barrier strip 30 absorbs the inwardly extending stress, avoiding the stress from tearing other films to generate cracks and propagating further inwards.

It should be noted that the groove 60 is provided at the edge portion of the flexible display panel, i.e., at the space region Y of the motherboard of flexible display panel before cutting. As illustrated in FIG. 14, in one embodiment, a binding region and a wiring region are provided at at least one side of the display panel. In a flexible display panel, the binding region and the wiring region are further bended towards the side away from the display side to be attached to the IC, thereby reducing the frame of the flexible display panel. In order to avoid the groove 60 form affecting the wiring in the binding region and wiring region, as illustrated in FIG. 15, at a side of the flexible display panel where the binding region and the wiring region are provided, the groove 60 is provided at a side of the binding region and the wiring region adjacent to the cutting line L.

Optionally, as illustrated in FIG. 16, organic material 70 may be filled in the groove 60.

As illustrated in FIG. 16, after forming the groove 60 using the above method, the organic material 70 may be filled in the groove 60 firstly. For example, PI filling (PIF) may be filled. Stress and crack are less likely to be generated in the organic material 70, and the generated creak is less likely to further propagate in the organic material 70. Accordingly, the organic material 70 is filled in the groove 60, and when the crack generated by the stress propagates to the position of the groove 60, the organic material 70 may effectively absorb the stress and meanwhile preventing the crack from further propagating. On this basis, by further providing the barrier strip 30, the capability and effect of blocking stress may be further improved. In the embodiment, as illustrated in FIG. 16, the orthogonal projection of the barrier strip 30 on the flexible base substrate 10 may be greater than the orthographic projection of the groove 60 on the flexible base substrate 10. Alternatively, the orthogonal projection of the barrier strip 30 on the flexible base substrate 10 may be equal to or smaller than the orthographic projection of the groove 60 on the flexible base substrate 10. In addition, the two projections may be partly overlapped. As long as it is ensured that the barrier strip 30 can be connected with at least one edge of the groove 60, that is, the barrier strip 30 is in contact with the inorganic insulating film 20.

Figure 15:
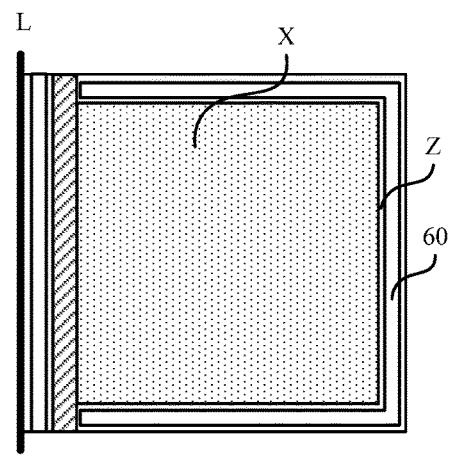
FIG. 15 is a schematic diagram illustrating a structure of a flexible display panel according an embodiment of the present disclosure.

Another aspect of the embodiment of the present disclosure provides a flexible display panel, as illustrated in FIG. 15, the flexible display panel includes a display unit X, a peripheral region Z around the display unit X, and the barrier strip 30. The barrier strip 30 is disposed in the peripheral region Z and is configured to stop the crack from extending towards the display units X across the barrier strip 30. As illustrated in FIG. 17, the flexible display panel includes a flexible base substrate 10 and a plurality of inorganic insulating films 20 provided on the flexible base substrate 10, and further includes a barrier strip 30 provided in the peripheral region Z, the barrier strip 30 is extended along a longitudinal direction of the peripheral region Z, and the barrier strip 30 is in contact with at least one of the inorganic insulating films 20.

It should be noted that, as illustrated in FIG. 15, the peripheral region Z refers to a periphery of the display unit X, and is the remaining part close to a side of the display unit X after the motherboard of flexible display panel are cut along the central line I of the space region Y or a position approximate to the central line.

In the flexible display panel according to the embodiment of the present disclosure, since the barrier strip 30 in contact with the inorganic insulating film 20 are provided on the peripheral region Z, the barrier strip 30 may absorb the stress generated at the edge of the flexible display panel due to cutting, collision or the like, and block the crack that may be generated in the inorganic insulating film 20 due to the stress, thereby effectively preventing the stress crack, that may be generated at the edge portion due to cutting and separating the motherboard of flexible display panel or due to collision or use of the separated flexible display panel, from further extending to the interior of the flexible display panel, thereby improving the display effect and operating stability of the flexible display panel.

According to a further aspect of the embodiment of the present disclosure, there is further provided a display device including the above flexible display panel.

The display device according to the embodiment of the present disclosure uses the above flexible display panel. Since the barrier strip 30 in contact with the inorganic insulating film 20 are provided on the peripheral region Z, the barrier strip 30 may absorb the stress generated at the edge of the flexible display panel due to cutting, collision or the like, and block the crack that may be generated in the inorganic insulating film 20 due to the stress, thereby effectively preventing the stress crack, that may be generated at the edge portion due to cutting and separating the motherboard of flexible display panel or due to collision or use of the separated flexible display panel, from further extending to the interior of the flexible display panel, thereby improving the display effect and operating stability of the flexible display panel.

The display device manufactured using the flexible display panel has been described in detail in the above detailed desperation on the motherboard of flexible display panel and the flexible display panel, which will not be repeated herein.

According to a further aspect of the present disclosure, there is providing a method for cutting a motherboard of flexible display panel. As illustrated in FIG. 18, the method includes:

S101: the motherboard of flexible display panel is cut along a cutting line. In the present embodiment, anyone of the above the barrier strip 30 is provided at both sides of the cutting line L.

As illustrated in FIG. 9, after being manufactured, the motherboard of flexible display panel according to embodiments of the present disclosure may be cut along the cutting line L. After cutting and separating the motherboard of flexible display panel along the cutting line into a plurality of flexible display panels, the respective flexible display panels are subjected to other process steps. In the present embodiment, the cutting of the motherboard of flexible display panel may be performed by a cutter wheel, that is cutting with the tip of the cutter wheel along the patch of the cutting line L. Alternatively, the cutting may be a laser cutting that selects an appropriately sized laser source and aims the emitted laser beam onto the cutting line L and performs the cutting along the cutting line L.

The barrier strip 30 is provided respectively on both sides of the cutting line to protect the display unit X of the flexible display panel on both sides of the cutting line L. With respect to the flexible display panel, the barrier strip 30 may be provided on the four sides thereof, to effectively protect the problems such as the collision from all the directions or the collision during the user.

The method for cutting the motherboard of flexible display panel according to embodiments of the present disclosure has been described in detail in the above detailed desperation on the structure of motherboard of flexible display panel, the cutting method thereof or the like, which will not be repeated herein.

The foregoing are merely specific implementations of the present disclosure, but the protection scope of the present disclosure is not limited thereto. Any change or the replacement easily available to the person skilled in the art within the technical scope disclosed by the present disclosure should be within the protection scope of the present disclosure. Therefore, the protection scope of the present disclosure should be based on the protection scope of the claims.

What is claimed is:

1. A motherboard of flexible display panel, comprising:
   a plurality of display units;
   a space region, disposed to at least separate adjacent ones of the display unis; and
   a barrier strip, disposed in the space region and configured to stop a crack from extending towards the display units across the barrier strip.

2. The motherboard of flexible display panel according to claim 1, further comprising a flexible base substrate and a plurality of inorganic insulating films provided on the flexible base substrate, and wherein the barrier strip formed of stress barrier material is provided between a central line of the space region and the display units at both sides of the central line, and the barrier strip is extended along a longitudinal direction of the space region, and the barrier strip is in contact with at least one of the inorganic insulating films.

3. The motherboard of flexible display panel according to claim 1, wherein
   at least two barrier strips are formed between the central line of the space region and each of the display units at both sides of the central line.

4. The motherboard of flexible display panel according to claim 3, wherein
   at least two columns of barrier strip extending along the longitudinal direction of the space region are disposed between the central line of the space region and the display units at both sides of the central line, and each column of barrier strip comprises a plurality of barrier segments arranged end to end, with an interval between adjacent two of the plurality of barrier segments, and a position of the interval in one column of the barrier strip and a position of the interval in an adjacent column of the barrier strip are not formed on a same line along a width direction of the space region.

5. The motherboard of flexible display panel according to claim 3, wherein
   at least two barrier strips are arranged in a same direction, and a head of one barrier strip is staggered with a tail of another barrier strip adjacent to the one barrier strip.

6. The motherboard of flexible display panel according to claim 1, wherein
   the barrier strip comprises a plurality of layers of barrier strip, and the barrier strips in different layers are connected to each other at at least one position.

7. The motherboard of flexible display panel according to claim 1, wherein
   the barrier strip comprises a metal strip formed of a metal film.

8. The motherboard of flexible display panel according to claim 1, wherein
   the barrier strip comprises a groove.

9. The motherboard of flexible display panel according to claim 8, wherein
   the groove is filled with metal.

10. The motherboard of flexible display panel according to claim 1, wherein
    the barrier strip comprises a groove and a metal strip formed of a metal film.

11. The motherboard of flexible display panel according to claim 10, wherein
    the groove is filled with metal.

12. The motherboard of flexible display panel according to claim 1, wherein
    the display unit comprises a thin film transistor comprising a gate electrode layer and a source/drain electrode layer, and
    the barrier strip is disposed in a same layer with at least one of the gate electrode and the source/drain electrode layer.

13. The motherboard of flexible display panel according to claim 12, wherein
    the barrier strip comprises a same material as the gate electrode layer or the source/drain electrode layer that is disposed in the same layer.

14. The motherboard of flexible display panel according to claim 12, wherein
    the barrier strip is disposed in two layers that are respectively the same with the gate electrode and the source/drain electrode layer, and
    the barrier strips in the two layers are connected to each other at at least one position.

15. The motherboard of flexible display panel according to claim 1, wherein
    the motherboard of flexible display panel comprises a thin film encapsulation, and
    the barrier strip is formed in a portion of the thin film encapsulation corresponding to the space region.

16. The motherboard of flexible display panel according to claim 15, wherein the motherboard of flexible display panel comprises a flexible base substrate, a first inorganic layer and a second inorganic layer of the thin film encapsulation are disposed on the flexible base substrate at the space region, a groove penetrating the first inorganic layer and the second inorganic layer and exposing the flexible base substrate is formed in the space region, and the barrier stripe is formed at least partly in the groove.

17. The motherboard of flexible display panel according to claim 16, wherein the groove is filled with organic material, and the barrier strip at least partly covers the groove.

18. A method for cutting the motherboard of flexible display panel according to claim 1, comprising:

cutting the motherboard of flexible display panel according to a central line of the space region as a cutting line, such that the barrier strip is provided respectively on both sides of the cutting line.

19. A flexible display panel, comprising:

a display unit;

a peripheral region around the display unit, and a barrier strip provided in the peripheral region and configured to stop a crack from extending towards the display units across the barrier strip.

20. A display device comprising the flexible display panel according to claim 19.

* * * * *